(12) United States Patent
Iadanza et al.

(10) Patent No.: US 6,334,169 B1
(45) Date of Patent: Dec. 25, 2001

(54) SYSTEM AND METHOD FOR IMPROVED BITWRITE CAPABILITY IN A FIELD PROGRAMMABLE MEMORY ARRAY

(75) Inventors: Joseph A. Iadanza, Hinesburg; Ralph D. Kilmoyer, Essex Junction, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/163,691

(22) Filed: Sep. 30, 1998

(51) Int. Cl.$^7$ .................................................. G06F 12/00
(52) U.S. Cl. .............................. 711/114; 711/154
(58) Field of Search ................................. 711/104, 114, 711/154; 365/189.08; 326/37, 39; 712/5, 224; 710/49

(56) References Cited

U.S. PATENT DOCUMENTS

| | | |
|---|---|---|
| 5,291,445 * | 3/1994 | Miyaoka et al. ............... 365/189.08 |
| 5,444,649 | 8/1995 | Nemirovsky . |
| 5,526,278 | 6/1996 | Powell . |
| 5,550,839 | 8/1996 | Buch et al. . |
| 5,644,496 | 7/1997 | Agrawal et al. . |
| 5,689,514 | 11/1997 | Saitoh . |
| 5,732,407 * | 3/1998 | Mason et al. ........................ 711/104 |
| 5,802,003 * | 9/1998 | Iadanza et al. ................. 365/230.03 |
| 5,914,906 * | 6/1999 | Iadanza et al. ................. 365/230.03 |

* cited by examiner

*Primary Examiner*—Matthew Kim
*Assistant Examiner*—Matthew D. Anderson
(74) *Attorney, Agent, or Firm*—Scully, Scott, Murphy & Presser; Mark F. Chadurjian, Esq.

(57) ABSTRACT

A highly flexible system for performing a bitwrite operation on each bit of a Field Programmable Memory Array, while maintaining low-level routing requirements. The system consists of a bitwrite control subarray which is equal in width to the number of memory cells per word of a Field Programmable Memory Array and equal in height to $2^N$ where N is the number chosen decode variations. Each cell of a Field Programmable Memory Array is associated via a bitwrite line with one cell of the bitwrite control subarray so that each cell can be independently controlled. The bitwrite control subarray can be programmed via a data bus prior to functional operation of the Field Programmable Memory Array, or while functional operation in the array continues.

11 Claims, 4 Drawing Sheets

SYSTEM AND METHOD FOR IMPROVED BITWRITE CAPABILITY IN A FIELD PROGRAMMABLE MEMORY ARRAY

BACKGROUND OF THE INVENTION

1. Field of the Invention

The invention relates generally to Field Programmable Gate Arrays and, more particularly, to embedded array structures to be incorporated within Field Programmable Gate Arrays.

2. Description of Prior Art

The concept of bitwrite for fixed memory arrays is well known in the industry. The bitwrite capability allows any number of select bits within a chosen memory word to be written, while other bits also accessed by this same address remain protected or masked and hence not written. Through this methodology a single memory address can be used to house status bits or other independently updated nibbles. Typically, the bitwrite capability has been included in compilable arrays for Application Specific Integrated Circuits (ASICs) using unique bitwrite lines for each bit in the stored word.

In the early 1980s the development of a new class of circuits called Field Programmable Gate Arrays (FPGAs) had begun. An FPGA is a chip, constructed of an array of general use uncommitted logic cells whose function and connectivity is user determined. Today, FPGAs are commonly known in the art, their common configurations include Look Up Tables (LUT), cell based, and the Programmable Logic Array (PLA) architectures. FPGAs combine the logic implementation capability, available in ASIC systems with the programmability features of PLAs. In many cases this programmability is non-destructive, and in some cases reconfiguration can occur on-the-fly without affecting the logic function of the chip as a whole.

With the development of FPGAs and their subsequent density growth beyond 10,000 gates, the need for on-chip reconfigurable memory resource has increased, paralleling the growth of memory requirements in ASIC products. A Field Programmable Memory Array (FPMA), addressing these needs and allowing memory use as Random Access Memory (RAM), Read Only Memory (ROM), Last In First Out (LIFO), First In First Out (FIFO), LUT, or register array with on-the-fly reconfiguration capability, has been described in a commonly owned U.S. Pat. No. 5,914,906.

U.S. Pat. No. 4,870,302 disclosed the Static Random Access Memory (SRAM) Cell-based FPGA architectures and on-the-fly reconfiguration capability within an FPGA.

Additionally, a commonly owned U.S. Pat. No. 5,914,906 describes the means for providing a flexible storage array system within an FPGA to provide a variety of memory related functions such as RAM, ROM, LIFO, FIFO, and cache. U.S. Pat. No. 5,802,003 discloses the means for initialization of array bit widths wider than the FPGA's configuration data bus. U.S. Pat. No. 5,646,544 details an FPGA cell architecture in which the cell's logic function is controlled by an array of configuration words. In that array, each configuration word is updatable on the fly from the configuration state machine and the configuration word of the larger set of configuration words chosen to program the cell is selectable from an independent source.

The FPMA architecture, comprising a block of uncommitted specialized cells within an FPGA optimized for generation of memory/data storage functions, provides for a number of subarrays. A subarray is an (M word)x(N bit) block of specialized cells capable of being configured as a one or two port RAM, register or other special memory functions. Each subarray can function as a stand alone array in any of the above modes, or can be combined with one or more other subarrays to form a taller or wider functional macro. The FPMA can be reconfigured for different usages on-the-fly. Since each subarray is required to operate in a stand-alone mode, routing resources in the FPGA surrounding the FPMA need to be robust enough to support all address, data, and control lines coming into or out of all subarrays of the FPMA, while maintaining enough resource to support logic wiring near or over the FPMA.

The resulting routing burden is large enough to force functional limitations on the FPMA. One such limitation is that from a routing perspective, the bitwrite, as implemented in ASIC compilable arrays was too expensive. As a result a much simpler bytewrite capability in which two bytewrite lines controlled the masking of the upper and lower half of the word was adopted. Thus, for an 18 bits per word implementation shown in FIG. 1, each bytewrite line 150, 155 controls the masking of 9 bits/ memory cells in parallel. While allowing a basic masking function and greatly reducing routing congestion around the FPMA, the functional flexibility of FPMA implemented arrays is significantly reduced.

a routing selection matrix that is provided to wire the FPMA bytewrite signals to the FPGA logic controlling them, and possibly to other subarrays within the FPMA block are omitted from FIGS. 1–4. Although the reduction of the routing resource required to make this connection for a given function level is advantageous, the exact type of a resource used to make the connection is not critical to the invention.

As shown in FIG. 1, the prior art FPMA system 100 comprises a set of writehead multiplexers 10 of a width equal to the width of an array word 110 comprising memory cells 115 and controlled in parallel to select one of a number of hierarchical data bitlines and programming bitlines 20, and receiving alternate control by a reset line 30 common to all writeheads. In addition to the multiplexing function of the writehead 10, true and compliment versions of the data to be written to the cell 115 are generated and the cell may be set or reset depending on which of the two write port lines 120, 125 is active low when the word line 140 is pulsed. The two byte write lines 130, 135 are anded with the true and compliment data for their respective bytes such that a true 130 or compliment 135 line only goes low if byte write is active. If neither line 130, 135 goes low, and the word line 140 is pulsed, the cell 115 retains its value. Although alternate implementations could be achieved at the cell level, all implementations are based upon gating data into the cell 115 based upon a bytewrite signal on lines 130, 135 and a wordline signal on line 140.

Thus, it would be highly desirable to provide an FPMA having a bitwrite capability that both minimizes routing requirements external to the FPMA and significantly improves both bitwrite flexibility and scalability of the system while allowing on-the-fly reconfiguration in concert with the other functions of the FPMA. The invention has applicability to the incorporation of additional functions into Application Specific Integrated Circuit based arrays

SUMMARY OF THE INVENTION

The present invention introduces a highly flexible system for performing a bitwrite operation on each bit of a FPMA. The inventive system maintains the low-level routing requirements of the bytewrite design as disclosed in a commonly owned U.S. Pat. No. 5,914,906 The system consists of a bitwrite control subarray which is equal in width to the number of memory cells per word of a given FPMA and equal in height to $2^N$ where N is the number chosen decode variations. For example, for a 2 byte, 16 bit word implementation with 2 input bytewrite lines, where the N is equal to 2 (input bytewrite lines), the bitwrite control subarray will be 16 bits wide and ($2^2$) or 4 bits high.

Where in the prior art all bits/memory cells in a byte of the Field Programmable Memory Array were associated with one bytewrite line, in the present invention each bit/memory cell is associated with one cell of the bitwrite control subarray via a bitwrite line. Hence, each cell of the Field Programmable Memory Array can be independently controlled.

The programming of the bitwrite control subarray can be achieved via a data bus prior to functional operation of the Field Programmable Memory Array, or while functional operation in the array continues.

DETAILED DESCRIPTION OF THE INVENTION

Figure 1:
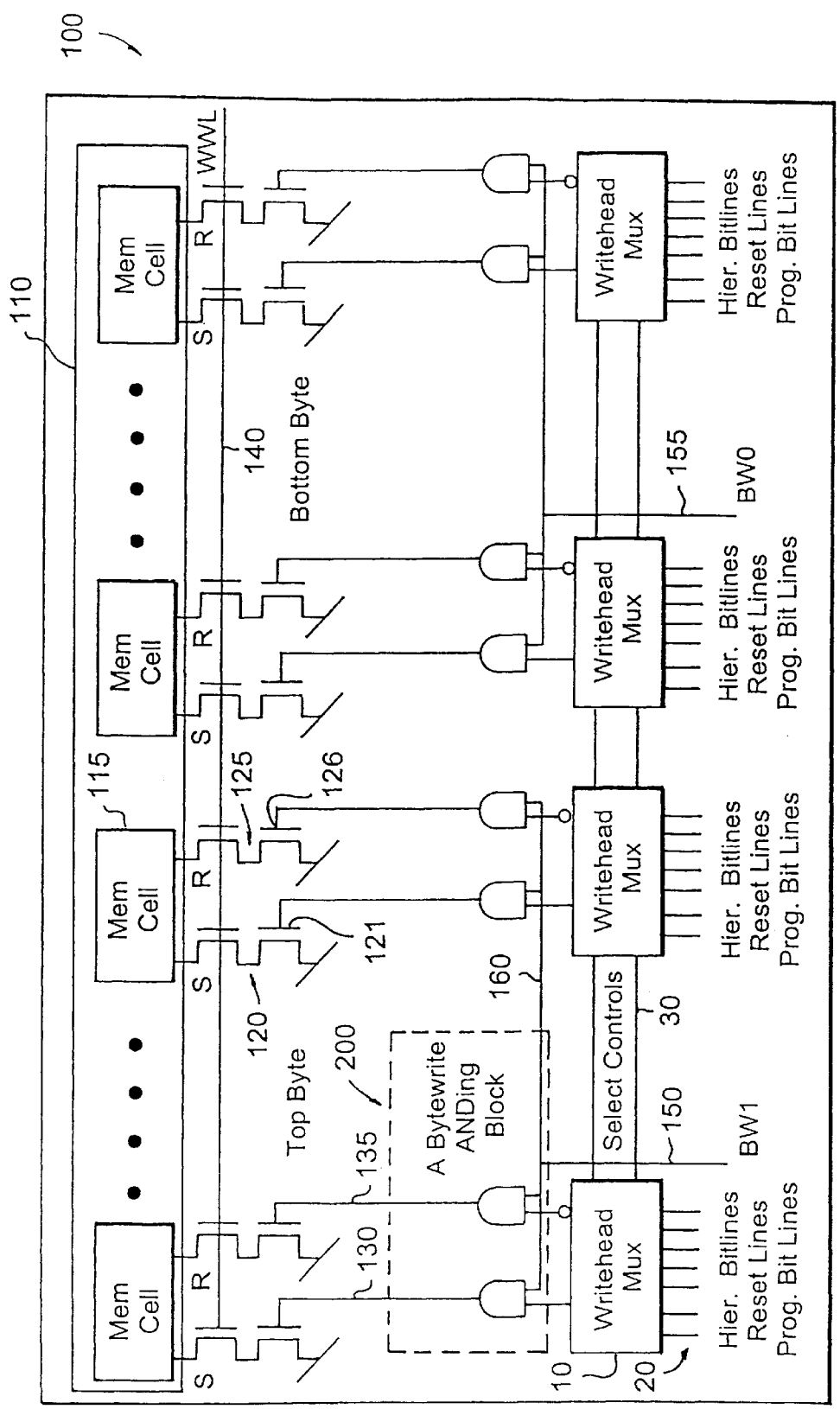
FIG. 1 is a schematic representation of a writehead/write bitline structure of a sub-portion of a FPMA of Prior Art, where the bits/memory cells are written using the bytewrite technique.

The present invention comprises improvements to FPMA described in a prior art as detailed in a commonly owned U.S. Pat. No. 5,914,906 entitled "Field Programmable Memory Array" the whole contents disclosure of which are incorporated by reference as is fully set forth herein. FIG. 1 shows the writehead mechanism 10, of the prior art, comprised of an ANDing function driver circuit 200, which generates write bitlines 130, 135. Bitlines 130, 135 are connected to gates 121, 126 of write data transistors of a multiplicity of memory cells 115 within a subarray 110 to selectively pull low write port lines 120, 125. Additionally, a detailed description of this writehead mechanism is described in a U.S. Pat. No. 5,802,003 entitled "System for Implementing Write, Initialization, and Reset in a Memory Array Using a Single Write Port", the whole contents disclosure of which are incorporated by reference as is fully set forth herein.

Figure 2:
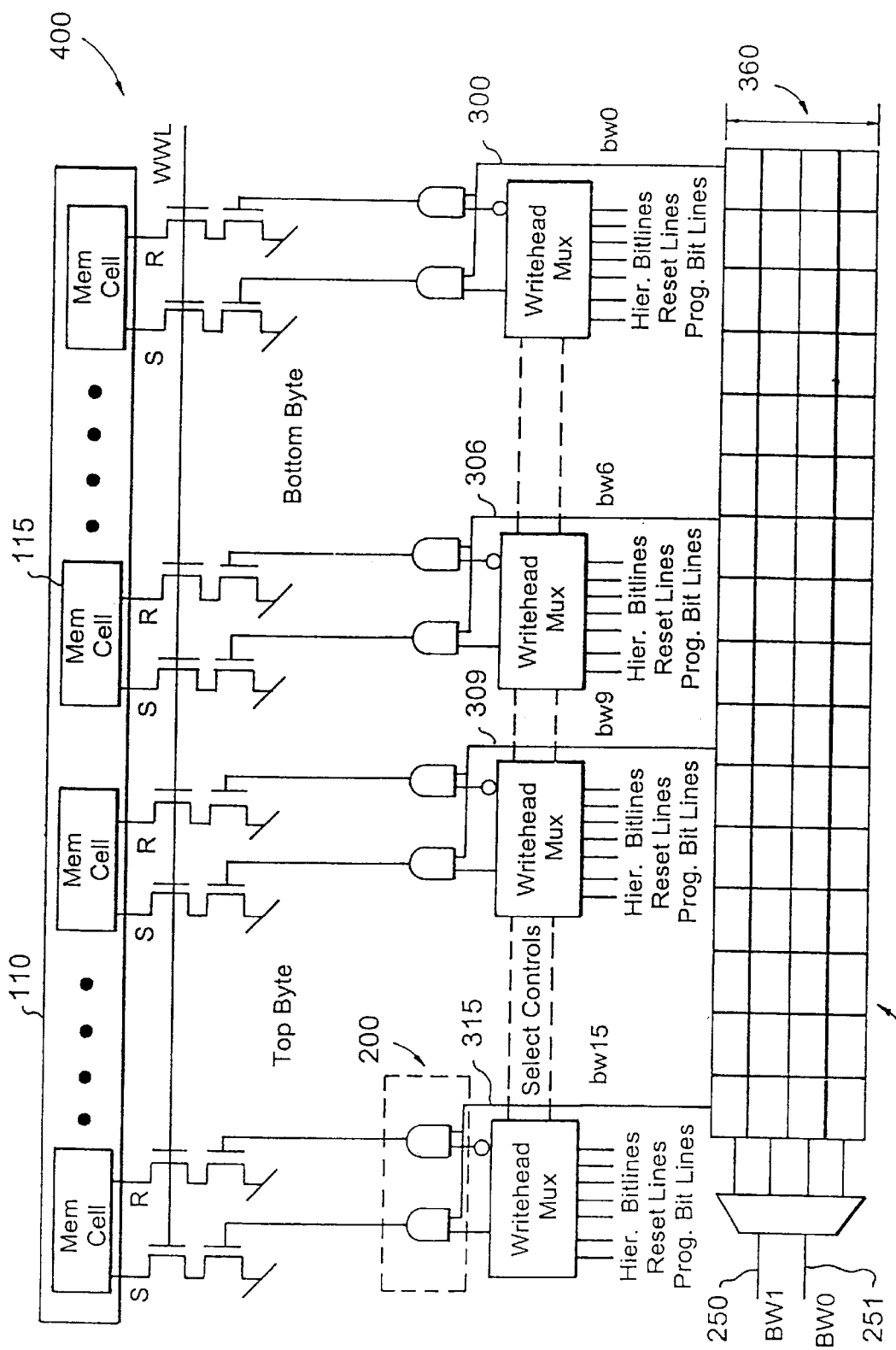
FIG. 2 is a schematic representation of a writehead/write bitline structure sub-portion of a FPMA of the present invention where each bit/memory cell is written via bitwrite by a bitwrite control subarray.

As shown in FIG. 2, the FPGA 400 of the present invention omits the direct control of the bytewrite ANDing function driver circuit 200 from BW0 150 (FIG. 1) and BW1 155 (FIG. 1) respectively. The bytewrite ANDing control line 160 (FIG. 1) is replaced by unique bitwrite lines 300–315 such that all bits or memory cells 115 within the word 110 can be controlled independently.

As shown in FIG. 2, another element of the invention is a bitwrite control subarray 350 which is equal in width to the number of bits/memory cells 115 per the word 110 of a memory array and in height 360 to the preferred decode possibilities. In the embodiment of the present invention shown in FIG. 2, the bitwrite control subarray 350 uses an equivalent number of input bytewrite lines 250, 251 as there are bytewrite lines 150, 151 (FIG. 1), and as many output lines 300–315 as there are memory cells 115 in the word 110 of a memory array.

The addition of the bitwrite control subarray 350 allows each of the bits/memory cells 115 to be controlled independently, such that complex orders of written and masked bits may be controlled without addition of unique bitwrite control lines for each data bit of the array. Furthermore, the bitwrite options are greatly expanded, moving the write selection from a function of N where N is the number of bitwrite lines to a function of $2^N$ without addition of any extra resource which requires routing. Thus, the addition of the bitwrite control subarray 350 enables large expansions of the bitwrite capability set, the array height 360, without significant increases in the number of bitwrite lines or routing resource required.

Yet another element of the FPGA structure 400 is a configuration resource 460 (FIG. 3) to program the bitwrite control subarray element prior to or in between functional operations of the FPGA.

Figure 3:
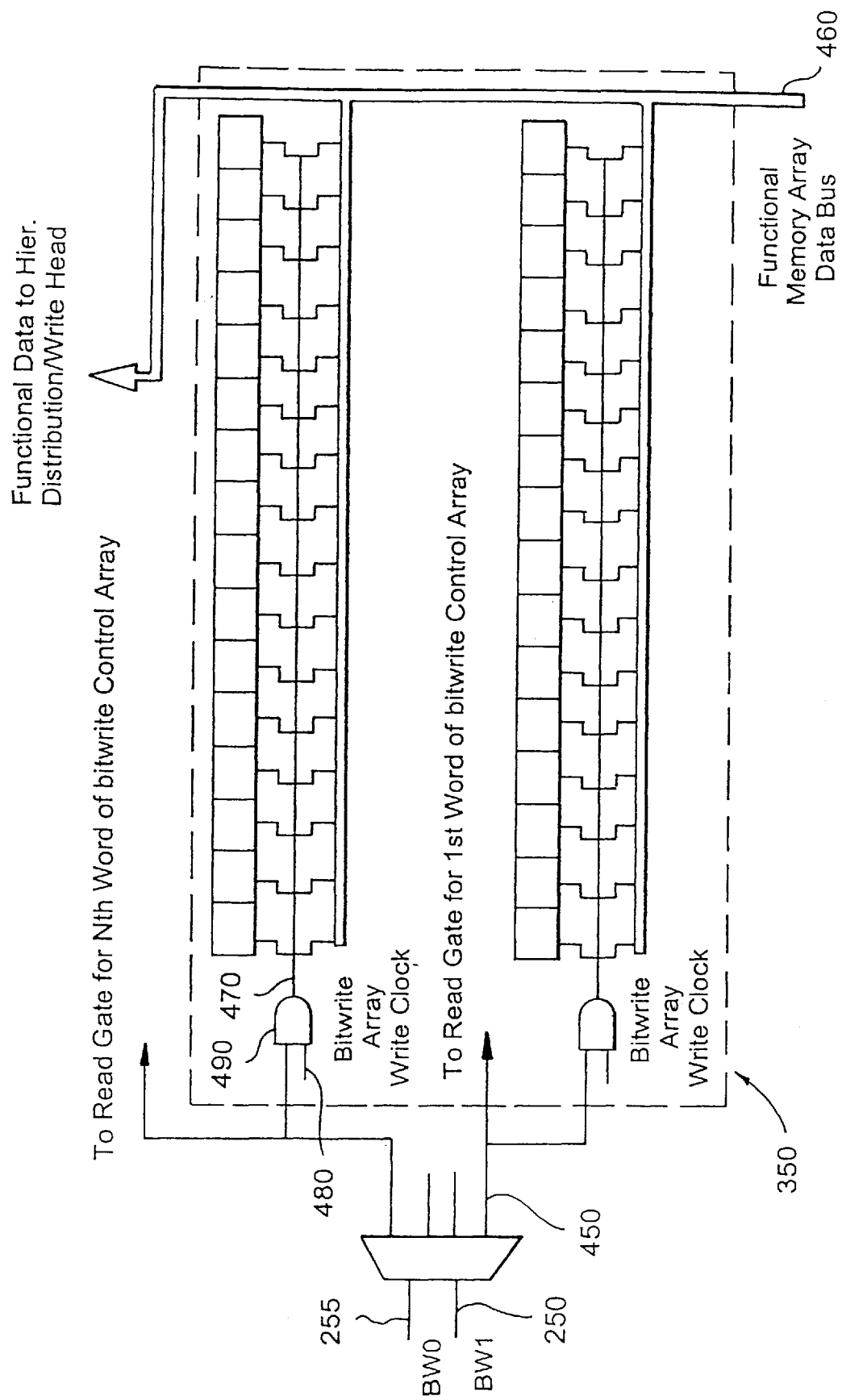
FIG. 3 is a schematic representation of the bitwrite control subarray of the present invention, where the programming of the bitwrite control subarray is performed via a functional memory array data bus.

In one embodiment, shown in FIG. 3, data to be written to the bitwrite control subarray 350 may be provided by the FPMA data inputs. The address control for the FPMA data inputs is provided by bytewrite lines BW1 250 and BW0 255. Bytewrite lines 250, 255 are decoded into bitwrite array read word lines 450 and anded with a bitwrite array write clock 480 forming the bitwrite array wordlines 470. The functional memory array data bus 460 is connected to cells of the bitwrite control subarray 350 via a transfer gate mechanism 490 as controlled by bitwrite array write word lines 470.

Bytewrite lines 250, 255, bitwrite array write clock 480, and the functional memory array data bus 460 are controllable from a source outside the FPMA, which may include FPGA implemented logic allowing the masks to be loaded into and accessed from the bitwrite control subarray 350. The functional memory array data bus 460 selectivity is in conjunction with, and has all the capability detailed in a commonly owned U.S. Pat. No. 5,914,906.

Figure 4:
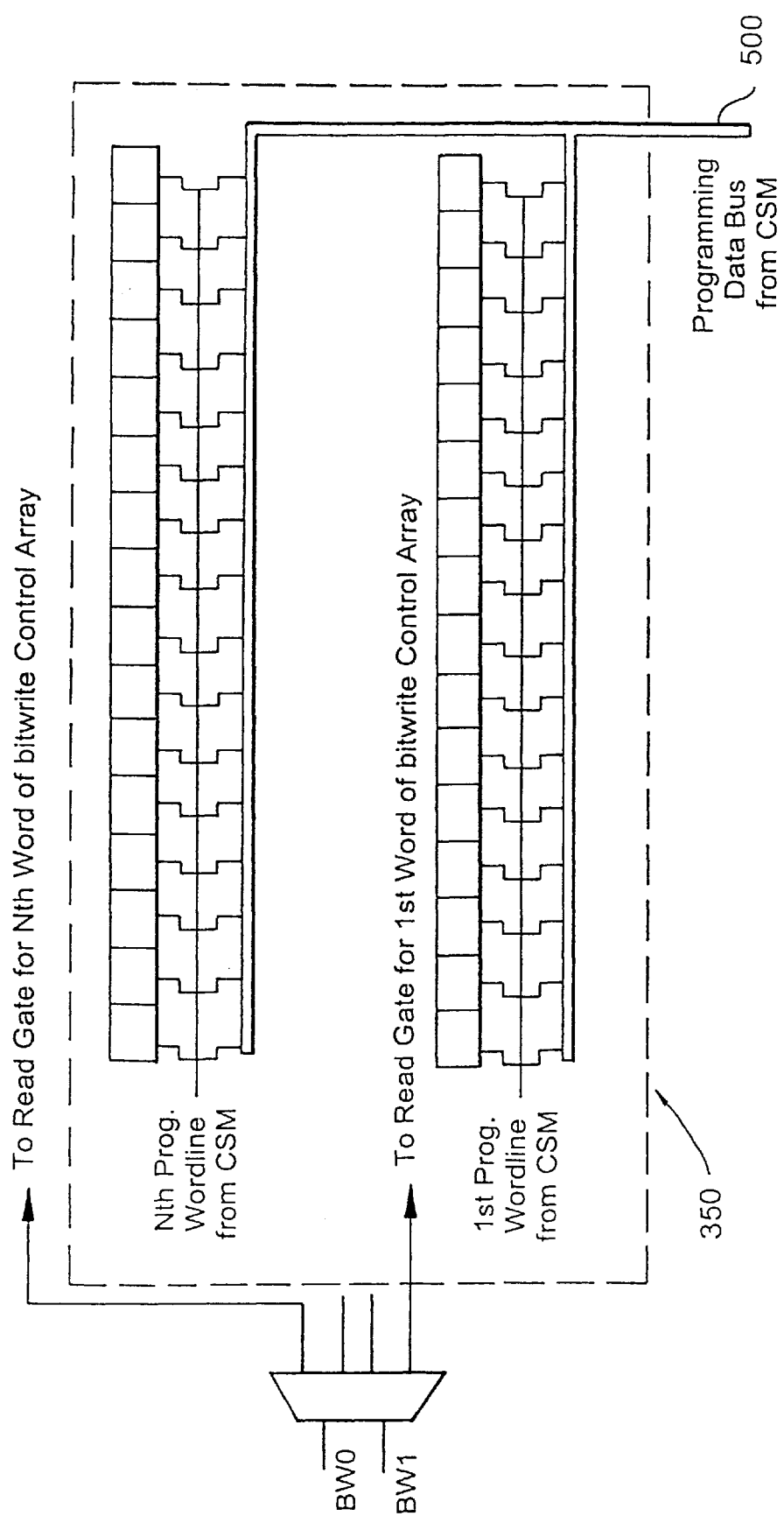
FIG. 4 is a schematic representation of the bitwrite control subarray of the present invention, where the programming of the bitwrite control subarray is performed via a programming data bus from a Configuration State Machine.

In the preferred embodiment, shown in FIG. 4, the write access to the bitwrite control subarray 350 is provided via the programming data bus 500 from the configuration state machine (CSM) configuration resource 600 resident in the FPGA/FPMA. The CSM receives configuration bitstream, i.e., the information providing control values for various multiplex and pass gate circuits which determine functionality of logic cells, the FPMA, and the routing.

In addition to receiving configuration bitstream, CSM controls signals from an outside source, divides the bitstream into address and data segments, and controls access to the distributed configuration memory of an SRAM based FPGA. CSM accomplishes all that in such a manner as to load the data segments of the configuration bitstream to proper addresses, thereby implementing a logical function.

Actual configuration data may flow in a manner similar to that outlined in a U.S. Pat. No. 5,802,003 entitled "System for Implementing Write, Initialization, and Reset in a Memory Array Using a Single Write Port", and U.S. Pat. No. 5,646,544 "System and Method for Dynamically Reconfiguring a Programmable Gate Array". The bitwrite control array 350 would have a specific address or addresses assigned to it for access via the CSM. If the bitwrite control array is wider than the programming data bus width, then multiple addresses may be provided to write the entire width of the array and that the bitwrite array may be given logic or storage capability in connection with the CSM to provide the byte write emulation to perform the function detailed in the U.S. Pat. No. 5,802,003.

a typical FPGA or FPGA/FPMA application starts with a netlist which defines logic functions, e.g., ANDs, ORs, Inverts, Latches, memory functions, chip level I/Os, and connectivity between the defined functions to implement an intended function. The netlist may be generated manually or through logic synthesis programs known in the art. There are several industry standard netlist formats including edif and xnf.

Once the netlist is complete, it is fed into a set of programs which are product specific at the detailed level. These programs have knowledge on the capability of an FPGA or FPMA including:

1. the number of logic cells available,
2. the logical function which they can perform,
3. the number of routing resources available, and
4. the types of wired connections each can implement between multiple metal wires or between metal wires and logic cells in the chip.

The place and route tool places the logical functions detailed in the netlist into physical FPGA cell locations and assigns connection paths between placed cell inputs and outputs and other logic functions in the netlist. The output from this process is a list of each logic cell resource and wiring resource within the FPGA and the function that it is to perform in the design. Each function possible has a set of programming data associated with it in order to implement the function and each physical resource within the FPGA or FPMA has associated with it one or more control words from the control array accessible via the CSM.

Given the list generated through place and route, a file may be generated which contains the programming bits for each logic cell and routing resource within the chip, and the addresses to which they must be stored to implement the function. This set of bit data is formatted into a bitstream, readable/executable by the CSM. The place and route to bitstream action handles the netlist, but does not necessarily handle initialization of user controllable arrays such as the bitwrite control array or initialization of a sub-array of an FPMA. These would be handled through user-defined files of a specific format which could be converted into bitstream data along with the placed and routed netlist.

In the present invention a bitstream is constructed by the FPMA user using a combination of patterns generated by the FPGA/FPMA place and route tool for the design, and the user constructed files detailing the contents of user-specified control arrays such as the bitwrite control subarray 350. Incoming bitstream data is tagged with address window information which may be decoded by the CSM to allow the writing of the bitstream to the proper bitwrite control subarray.

As only one word of any bitwrite control subarray is actively driving the bitwrite controls at any one time, all other words within the array may be updated while functional operation in the array continues.

While the invention has been particularly shown and described with respect to illustrative and preferred embodiments thereof, it will be understood by those skilled in the art that the foregoing and other changes in form and details may be made therein without departing from the spirit and scope of the invention that should be limited only by the scope of the appended claims.

Having thus described our invention, what we claim as new, and desire to secure by Letters Patent is:

1. A system for performing a bitwrite operation within each of a plurality of subarrays within a field programmable memory array, the system comprising:

a memory subarray including a plurality of memory words each being uniquely addressable for reading or writing data thereto, and each word comprising a plurality of first memory cells;

a plurality of write bitlines means within the memory subarray, each write bitline means corresponding to an associated first memory cell of a memory word within the memory subarray for the purposes of carrying data to or from said first memory cell of a memory word within the subarray;

a plurality of write wordlines within the memory subarray, a write wordline connected to all said first memory cells within said memory word for the purposes of selectively propagating data between each write bitline means and the memory word within the array;

a bitwrite line means associated with a respective write bitline means, for independently enabling said write bitline means to perform a write operation on a bit by bit basis within said memory word;

a programmable bitwrite control subarray having a plurality of second memory cells arranged in a first dimension equal in number to the plurality of said memory cells forming said memory word and a second dimension equal to $2^N$ where N is a number of inputs to said bitwrite control subarray, at least one of said plurality of second memory cells selectively connectable to each of said bitwrite line means to provide simultaneous independent write access to one or more first memory cells which form a subset of first memory cells within said memory word within said memory subarray, said bitwrite control subarray receiving an N-bit address for functionally selecting one or more of said second memory cells within said bitwrite control subarray to be connected to said bitwrite line means; and a data bus forming inputs to said bitwrite control subarray to program said one or more of said second memory cells within said bitwrite control subarray according to one or more user defined functional bitwrite patterns, a bitwrite pattern selectably connectable to respective bitwrite line means in response to a received N-bit address, wherein up to $2^N$ bitwrite patterns may be programmed.

2. The system of claim 1, wherein said bitwrite control subarray includes reading and writing means.

3. The system of claim 2, wherein said bitwrite control subarray is programmed prior to functional operation of said field programmable memory array.

4. The system of claim 2, wherein said bitwrite control subarray has reconfiguration capability to be programmed after function operation of said field programmable memory array has commenced.

5. The system of claim 2, wherein said bitwrite control subarray has update capability to be programmed using logic-based masking.

6. The system of claim 2, wherein said bitwrite control subarray is written to by a configuration state machine prior to initialization of said bitwrite control subarray and subsequently rewritten into a functional instructions.

7. The system of claim 2, wherein said bitwrite control subarray is programmed from a data source external to said field programmable gate array via a functional data bus.

8. The system of claim 2, wherein said bitwrite control subarray is programmed from a a data source common to said field programmable gate array via a common programming source.

9. The system of claim 2, wherein said bitwrite control subarray includes hardware encoded bytewrite instructions for initialization of said field programmable memory array.

10. The system of claim 9, wherein said bitwrite control subarray includes logical means to override bitwrite instructions in response to a configuration state machine command sequence for said initialization of said field programmable memory array.

11. The system of claim 9, wherein said bitwrite control subarray includes logical means to override bitwrite instructions in response to a configuration state machine command sequence for said initialization of said bitwrite control subarray.

* * * * *